United States Patent [19]
Calabro

[11] 3,950,057
[45] Apr. 13, 1976

[54] COMPOSITE PRINTED CIRCUIT CARD GUIDE AND HOLDING DEVICE

[76] Inventor: Anthony D. Calabro, 8738 West Chester Pike, Upper Darby, Pa. 19082

[22] Filed: June 2, 1975

[21] Appl. No.: 582,617

[52] U.S. Cl. ............... 339/65; 211/41; 317/101 D; 339/176 MP
[51] Int. Cl.² .......................................... H01R 13/62
[58] Field of Search ........ 339/17 LM, 17 M, 65, 66, 339/75 MP, 91 R, 176 MP; 211/41; 317/101 CM, 101 D, 101 DH

[56] References Cited
UNITED STATES PATENTS
2,731,609  1/1956  Sobel............................ 339/17 M OTHER PUBLICATIONS
Product Engineering, Schuster, Printed Circuit Guides, 6-1963, pp. 96 & 97.
Product Engineering, Schuster, Printed Circuit Guides, 5-1963, pp. 36 & 36.
Taurus Circuitrak Printed Circuit Board Holders, 3-1975.

*Primary Examiner*—Joseph H. McGlynn
*Attorney, Agent, or Firm*—Anthony J. Casella

[57] ABSTRACT

A composite printed circuit card guide and holding device comprises a U-shaped elongated member made of a rigid material, and including two upstanding arm members having inwardly directed flanges which are spaced a sufficient distance to enable the passage therethrough of the edge of the printed circuit card. Printed circuit card engaging means are slidably received within the U-shaped member, which printed circuit card engaging means includes a plurality of opposed, cantilevered flexible spring fingers extending into the region where the printed circuit card is mounted thereby resiliently engaging and holding the printed circuit card.

12 Claims, 10 Drawing Figures

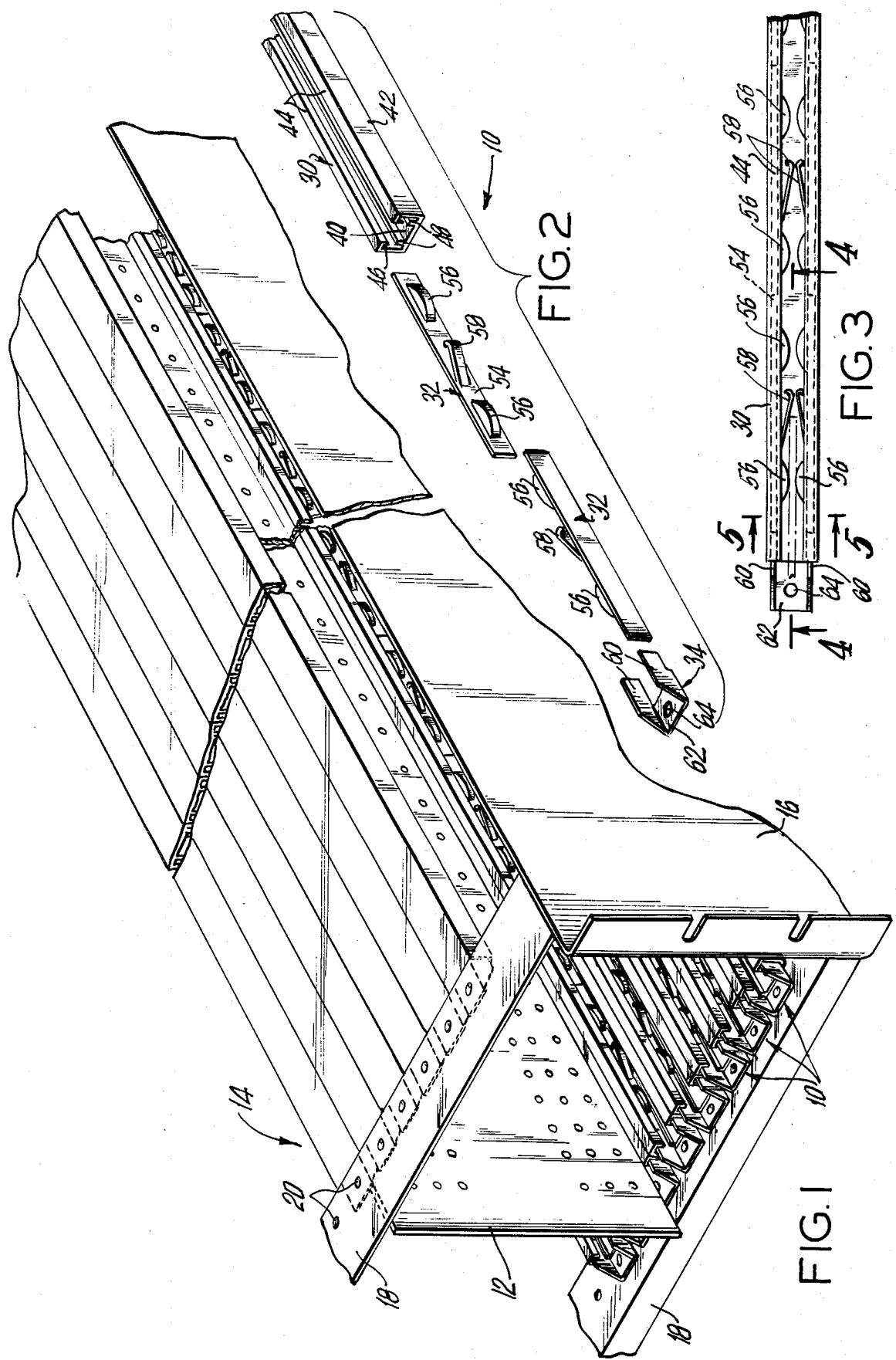

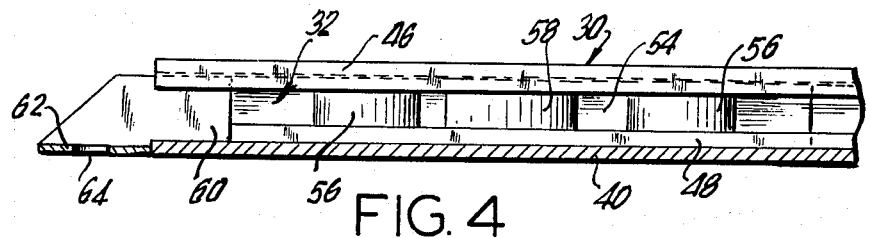
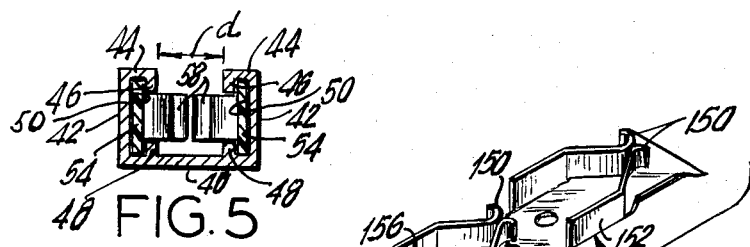
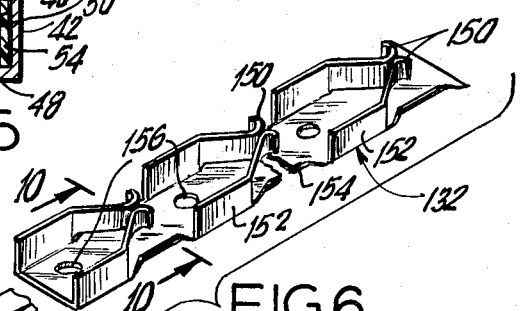
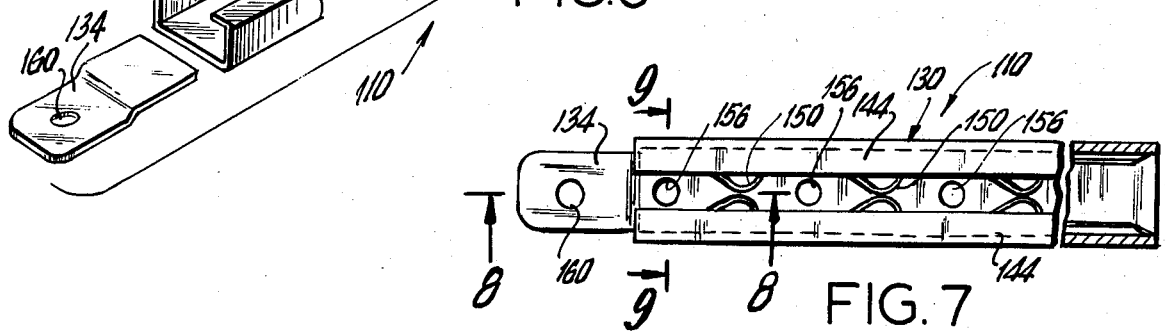
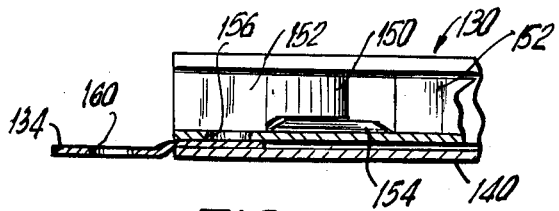
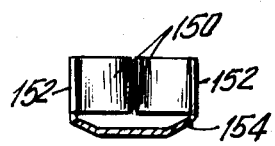
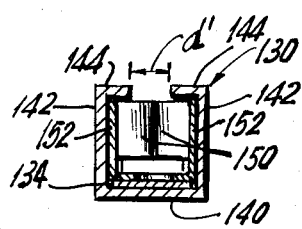

COMPOSITE PRINTED CIRCUIT CARD GUIDE AND HOLDING DEVICE

The present invention relates to the mounting and fastening of modular panels, board or cards which in turn mount circuits such as printed circuits, within a panel rack or cage utilized in connection with electronic equipment or the like.

U.S. Pat. No. 3,231,785 which issued on Jan. 25, 1966 to the inventor of the subject application, and entitled "Circuit Board Mounting Device" discloses the basic concept of an integral holding device which includes unitary spring fingers for securing the above mentioned panels within their rack or cage mounting. For applications where the printed circuit board or panel is on the order of seven or eight inches, the unitary circuit board mounting device disclosed in said patent is excellent for maintaining a printed circuit board in place, even in the presence of shock and vibration. The patented circuit board mounting device is of unitary construction, preferably of a plastic material which, over the relatively short length of approximately eight inches, is fairly rigid in order to securely hold the printed circuit panel. However, with advanced technology, it has been found that there are requirements for mounting large size printed circuit boards, on the order of two to three feet, in a stable condition, and in a manner so as to provide support for the board for spanning large open spaces. In addition, considering the number of components mounted on the board, there is a great need for providing means in the form of heat conducting structures for achieving good heat transfer from the printed circuit board to the surrounding structure or atmosphere. Still further, in certain applications it is desirable that the circuit board mounting device should also provide electrical grounding for the printed circuit board. Another object of the invention is to provide spacer or gage means for assisting the spring finger dampening means of the subject device from overstressing the fingers due to vibrations of the printed circuit board brought about by either mechanical vibrations in the chasis of the electronic system, or by the vibrations created in the printed circuit board when electrical power is applied thereto.

With the above objects in mind, and in view of the advances of the state of the art of the development of large size printed circuit boards, it is an object of the subject invention to provide a new and improved circuit board mounting device, and more particularly a composite printed circuit card guide and holding device which is rigid for maintaining and holding a large printed circuit board which spans over large open spaces; inherently includes good heat conduction characteristics for transferring heat from the printed circuit board to the surroundings; and is made of a good electrical conducting material so as to provide the capability of grounding of the printed circuit board, when required.

These and other features of the present inventiontion will be more fully appreciated when considered in light of the following specification and drawings, in which:

FIG. 1 is a perspective view of a typical installation for composite printed circuit card guide and holding devices made according to the present invention;

FIG. 2 is an exploded perspective view of a first embodiment of a composite printed circuit card guide and holding device made according to the subject invention;

FIG. 3 is a plan view of the device of FIG. 2;

FIG. 4 is a sectional view taken along the line 4—4 in FIG. 3;

FIG. 5 is a cross-sectional view taken along line 5—5 in FIG. 3;

FIG. 6 is an exploded perspective view of a second embodiment of a composite printed circuit card guide and holding device made according to the subject invention;

FIG. 7 is a plane view of the second embodiment of the subject device;

FIG. 8 is a sectional view taken along line 8—8 in FIG. 7;

FIG. 9 is a cross-sectional view taken along line 9—9 in FIG. 7; and

FIG. 10 is a cross-sectional view taken along line 10—10 in FIG. 6.

Turning to FIG. 1, it will be observed that a plurality of composite printed circuit card guide and holding devices 10 of the first embodiment of the subject invention may be utilized in connection with panels or circuit boards 12 supported within a rack or cage, which is generally designated by numeral 14. The rack 14 is of the type which is constructed from end plate members 16 interconnected by parallel spaced channel members 18 to which parallel spaced devices 10 are usually secured for receiving and holding the printed circuit cards 12 in parallel spaced relation to each other. The printed circuit cards 12 are therefore inserted into the cage from one side between the parallel spaced channels 18. The latter are normally provided with a plurality of spaced apertures 20. In accordance with the present invention, the composite printed card guide and holding devices 10 are secured to the cage by suitable means such as rivets, screws and other similar fastening devices which extend through the spaced apertures The length of the composite printed card guide and holding device is a function of the size of the printed circuit board 12. As noted above, with the development of advanced technology, larger and larger printed circuit boards are employed, whereby the distance, from front to rear, between the parallel spaced channel elements 18 is becoming greater and greater, whereby it is necessary for the card guide and holding device 10 to span greater lengths. Accordingly, it is necessary that the card guide and holding device 10 be sufficiently rigid, and capable of spanning large areas, without deforming or bending, and in a manner to rigidly engage and hold the circuit card 12, even in the presence of shock and vibration. In order to achieve this capability of holding large printed circuit cards, and at the same time providing means for resiliently engaging the printed circuit card 12 in order to dampen the effects of vibration and shock, the subject invention provides a composite printed card guide and holding device which is shown in exploded view in FIG. 2. Fundamentally, the first embodiment of the card guide and holding device 10 comprises an elongated, rigid U-shaped member 30 (which is preferably made of extruded aluminum), a plurality of printed circuit card engaging means 32 (which may be made of resilient plastic material), and end holding clips 34. Referring first to the elongated, rigid U-shaped member 30, it is first noted that this member should be of a sufficient length to span the entire distance between the front and rear parallel spaced channel members 18, and as shown in FIG. 5, member 30 is generally U-shaped including a base 40, and two upstanding arms 42. Each of the latter is provided with an inwardly directed flange 44, with the space between the respective flanges 44, 44 defining a distant $d$ which is greater than the thickness of the printed circuit card 12. Extending downwardly from the end of each flange 44 is projection 46 which is disposed immediately above a corresponding parellel rib 48 which extends along the entire length of the member 30. The combination of each upstanding arm 42, flange 44, projection 46, and rib 48 define a slot 50 in each upstanding arm. The two opposed slots 50, 50 in each member 30 extend along the entire length of said member, and each slot is adapted to receive a plurality of printed circuit card engaging means 32. As shown in FIG. 2, each printed circuit card engaging means 32 includes a unitary construction of a flexible thin strip 54 adapted to be slidably received in the slot 50, and having projecting from one side thereof two arcuate spacers 56, 56, and intermediate thereof a cantilevered flexible spring finger 58. As illustrated in FIGS. 3, 4 and 5, the arcuate spacers 56 and the spring finger 58 are suitably dimensioned in order to project from the slot 50 between the downwardly directed projection 46 and the associated parallel rib 48. Basically, when a plurality of printed circuit card engaging means 32 are positioned within the U-shaped member 30, the cantilevered spring fingers 58 of the respective printed circuit card engaging means 32 are in opposed relationship (see FIG. 3) so as to resiliently engage the opposite sides of the printed circuit board received within the composite device 10. The arcuate spacers 56 are also in opposed relationship, and are primarily provided to function as a limiting gage for the composite device 10 to insure that the printed circuit board attempted to be inserted into device 10 is of the proper size. In other words, the composite printed card guide and holding device 10 is constructed to accomodate a certain range of thickness of printed circuit boards 12, and the upper limit of that range corresponds to the spacing between the opposed arcuate spacers 56 when fully assembled in the rigid U-shaped member 30. In addition, spacers 56 function as stops or limits to prevent the overstressing of the spring fingers. In other words, if the printed circuit board moves (i.e., vibrates) to a large degree, the board will contact the spacers 56 and thus preclude overstressing or straining of the spring fingers.

In order to mount the composite printed circuit card guide and holding device to the cage 14, holding clips 34 are provided, and are slidably accommodated into the ends of the elongated, rigid U-shaped member 30. As illustrated in FIG. 2, each holding clip 34 is of generally U-shaped configuration, and includes extended arms 60 which are slidably received within the slots 50, 50 of member 30, as well as a base portion 62 having an aperture 64 therein. In order to mount the holding clip 34 to the channel element 18, suitable fastening means are provided so as to extend between the aligned holes 62 and 20, which fastening means may be rivets, nuts and bolts, or the like.

The composite printed circuit card guide and holding device illustrated in FIGS. 1 through 5 provides rigid support for large printed circuit boards which span relatively large distances, and also provides positive holding spring finger design in order to achieve the desirable characteristics of vibration dampening and shock dampening. Still further, because of the metallic construction of the rigid U-shaped member 30, good heat dissipation characteristics are provided, and if required, electrical grounding may be effected through the device 10. Because of the use of modular printed circuit card engaging means 32, the length of the device 10 may be varied, as required. In other words, the device 10 may be provided with extremely long lengths of U-shaped members 30, and may be cut to length, with the necessary number of printed circuit card engaging means 32 being slidably mounted within the member 30, and with the opposite ends of member 30 being terminated by suitable holding clips 34 for attachment to the cage or frame.

FIGS. 6 through 10 illustrate a second embodiment of the subject composite printed circuit card guide and holding device 110. As shown in FIG. 6, the second embodiment basically comprises an elongated, rigid U-shaped member 130, a printed circuit card engaging means 132 in the form of a strip of flexible metal formed to include opposed, cantilevered flexible spring fingers, and holding clips 134 slidably received within the member 130. Referring more specifically to FIG. 9, in cross section it is seen that the U-shaped member 130 includes a base 140, and upstanding arms 142, 142, from which project inwardly directed flanges 144, with the space in between the ends of the flanges being designated by $d'$. The spacing $d'$ corresponds to the maximum thickness of printed circuit board to be accommodated by the device 110. In addition, the spacing $d'$ limits the amount of vibration or movement of the printed circuit board thereby ensuring that the spring fingers are not overstressed or strained. As indicated previously, the vibration of the board may be brought about by either mechanical vibrations of the cage, or by the vibrations generated in the board itself when electrical power is applied to the board. Preferably, the member 140 is formed of an extruded aluminum material which is light weight, and yet is sufficiently rigid for supporting large printed circuit boards.

As shown in FIGS. 6 through 10, the printed circuit card engaging means 132 is likewise of generally U-shaped configuration, and is preferably formed of a spring temper beryllium copper, phosphor bronze or stainless steel. Being formed of metal, this embodiment 110 of the invention is particularly suited for dissipating heat from "hot" printed circuit boards and/or may be used for grounding the boards. The printed circuit guide engaging means 132 is formed so as to define opposed cantilevered spring fingers 150. Intermediate the supporting walls 152 for the spring fingers 150, the metal strip forming the printed circuit guide engaging means is indented as in 154 in order to add additional longitudinal rigidity to the means 132. As shown in FIG. 8, the vertical height of each spring finger 150 is less than the total height of the upstanding supporting wall 152 in order to provide additional material for formation of the indentation 154. Apertures 156 may be provided in the base of the engaging means 132.

For the purposes of mounting U-shaped member 132 to a cage, holding clips 134 are provided, and may be slidably received between the respective bases of the engaging means 132 and the U-shaped member 130. Each holding clip 134 is provided with an aperture 160 for receiving a fastening means for connection to the cage. For certain applications clips 134 may be dispensed with, and in such cases the length of the engaging means 132 is less than the length of the member 130. The end portions of the latter would then be drilled through to accomodate suitable fastening means.

As viewed in FIG. 7, the spacing between the flexible cantilevered spring fingers 150 is less than the spacing $d'$ between the inwardly directed flanges 144 of the U-shaped member 130 so as to insure a spring biased, rigid supporting means for the printed circuit board.

As indicated above, the embodiment 110 of the subject invention is particularly adapted for engaging large printed circuit boards. The all-metal construction of the device 110 is highly efficient for dissipating heat from the printed circuit board, and may be employed for purposes of electrically grounding the boards. The composite construction of the device 110 is particularly useful for dampening shock and vibrations applied to the board, and the extruded construction of the U-shaped member 130, and the particular construction of the guide engaging means 132 provide a low cost device having the desirable characteristics enumerated above. In like manner, the extruded construction of elongated member 30 and the molded construction of plastic printed circuit card engaging means 32 of devices 10 results in a low cost device.

As readily apparent numerous modifications and changes may readily occur to those skilled in the art, and hence it is not desired to limit the invention to the exact construction and operation shown and described, and accordingly all suitable modifications and equivalents may be resorted to, falling within the scope of the invention as claimed. For example, for extremely large printed circuit boards, alternate engaging means 32 may be formed without spring fingers thereby reducing the amount of insertion force of the boards, without substantially reducing the holding or gripping force of the device 10. Also, the spring fingers may be opposed, and yet staggered along the length of the board. Still further, the U-shaped member 30 may be made of other rigid materials such as steel, or hard plastic material.

What is claimed is:

1. A composite printed circuit card guide and holding device comprising:
   an elongated, rigid U-shaped support member including a base and two upstanding arm members, with inwardly directed flanges extending from each upstanding arm and spaced a sufficient distance to enable the passage therethrough of the edge of the printed circuit card; and
   printed circuit card engaging means slidably received within said U-shaped member, said printed circuit card engaging means including a plurality of opposed, cantilevered, flexible spring fingers extending into the region wherein said printed circuit card is received so as to resiliently engage and hold said card.

2. A composite printed circuit card guide and holding device as in claim 1 wherein each upstanding arm defines a longitudinally extending slot for slidably receiving the printed circuit card engaging means.

3. A composite printed circuit card guide and holding device as in claim 1 wherein said printed circuit card engaging means comprises a strip of flexible metal formed in generally U-shaped cross-section to include a base, upstanding arms, and opposed, cantilevered flexible spring fingers projecting from said upstanding arms.

4. A composite printed circuit card guide and holding device as in claim 3 wherein the base of said flexible strip is indented at spaced intervals to provide additional reinforcement to the strip.

5. A composite printed circuit card guide and holding device as in claim 3 wherein said base includes a plurality of spaced apertures extending along the length of said strip.

6. A composite printed circuit card guide and holding device as in claim 3 wherein the height of each cantilevered spring finger is less than the height of its associated upstanding arm.

7. A composite printed circuit card guide and holding device as in claim 3 wherein said strip is made of beryllium copper.

8. A composite printed circuit card guide and holding device as in claim 3 further including holding clips connected to the opposite ends of said elongated rigid U-shaped support member for connecting the composite printed circuit card guide and holding device to a cage.

9. A composite printed circuit card guide and holding device as in claim 1 wherein said U-shaped support member is made of an extruded metallic material, and includes two elongated, parallel ribs which extend upwardly from the base of said support member and are spaced a distance corresponding to the space between said inwardly directed flanges, with the latter further including downwardly directed projections whereby each upstanding arm defines an elongated slot for receiving the printed circuit card engaging means.

10. A composite printed circuit card guide and holding device as in claim 9 wherein a plurality of printed circuit card guide engaging means are provided, with each printed circuit card engaging means comprising a unitary elongated strip of flexible material having two projecting spacers extending from one side thereof, and a cantilevered flexible spring finger extending from the same side of said strip, intermediate said two spacers.

11. A composite printed circuit card guide device as in claim 10 wherein the printed circuit card guide engaging means are made of plastic material.

12. A composite printed circuit card guide and holding device comprising:
   an elongated, rigid U-shaped support member including a base and two upstanding arm members, said arm members being slotted along the longitudinal length thereof; and
   a plurality of printed circuit card engaging means slidably received within the slotted portions of said upstanding arms, each printed circuit card engaging means comprising a unitary elongated strip of flexible plastic material having two projecting spacers extending from one side thereof, and a cantilevered flexible spring finger extending from the same side of said strip, intermediate said spacers, which cantilevered spring finger is adapted to resiliently engage the printed circuit card received within the U-shaped support member.

* * * * *